US 6,484,277 B1

(12) United States Patent
Schönemann

(10) Patent No.: US 6,484,277 B1
(45) Date of Patent: Nov. 19, 2002

(54) INTEGRATED MEMORY HAVING A REDUNDANCY FUNCTION

(75) Inventor: Konrad Schönemann, Sulzfeld/Baden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/575,056

(22) Filed: May 19, 2000

(30) Foreign Application Priority Data

May 19, 1999 (DE) ............................... 199 22 920

(51) Int. Cl.⁷ ............................................ G11C 29/00
(52) U.S. Cl. ........................................ 714/710; 714/711
(58) Field of Search ............................. 365/200; 714/711, 714/7, 710, 718

(56) References Cited

U.S. PATENT DOCUMENTS

| 4,051,354 | A |   | 9/1977  | Choate .................... 714/711 |
| 4,051,356 | A |   | 9/1977  | Hakata ..................... 341/83 |
| 4,720,817 | A | * | 1/1988  | Childers .................. 365/200 |
| 4,791,615 | A | * | 12/1988 | Pelley, III et al. ........ 714/711 |
| 4,881,202 | A | * | 11/1989 | Tsujimoto et al. ......... 365/200 |
| 5,224,073 | A | * | 6/1993  | Nakayama ................. 365/200 |
| 5,457,655 | A |   | 10/1995 | Savignac et al. .......... 365/200 |
| 5,548,554 | A | * | 8/1996  | Pascucci et al. .......... 365/200 |
| 5,604,702 | A | * | 2/1997  | Tailliet ................... 365/200 |
| 5,959,906 | A | * | 9/1999  | Song et al. ............... 348/223 |
| 6,115,828 | A | * | 9/2000  | Tsutsumi et al. ........... 714/7 |

FOREIGN PATENT DOCUMENTS

EP       0 612 074 A1    8/1994

\* cited by examiner

Primary Examiner—David Ton
(74) Attorney, Agent, or Firm—Laurence A. Greenberg; Werner H. Stemer; Gregory L. Mayback

(57) ABSTRACT

A memory has coding units that are used for allocating any one of redundant lines at a time to any one of first lines on an address basis. Each coding unit has a programmable activation unit. In a first programming state of the activation unit, the associated coding unit, when programmed, allocates a complete redundant line to a complete first line on an address basis. In a second programming state of the activation unit, the associated coding unit, when programmed, allocates only one of the subregions of one of the redundant lines to a corresponding subregion of one of the first lines on an address basis.

6 Claims, 3 Drawing Sheets

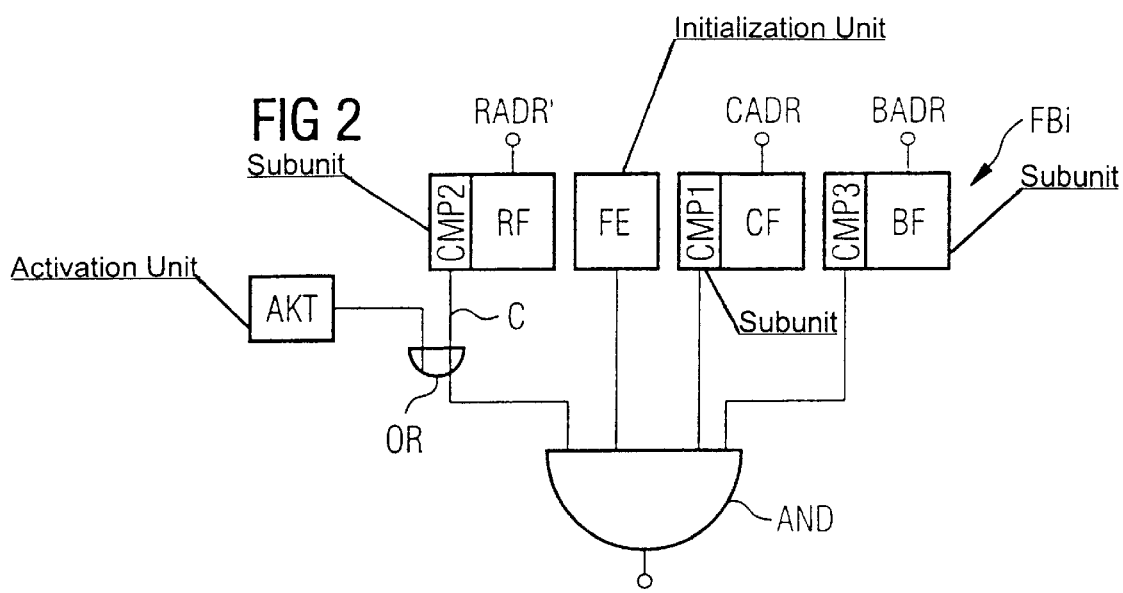
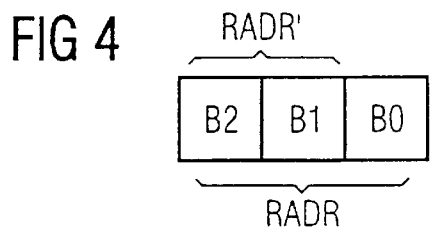
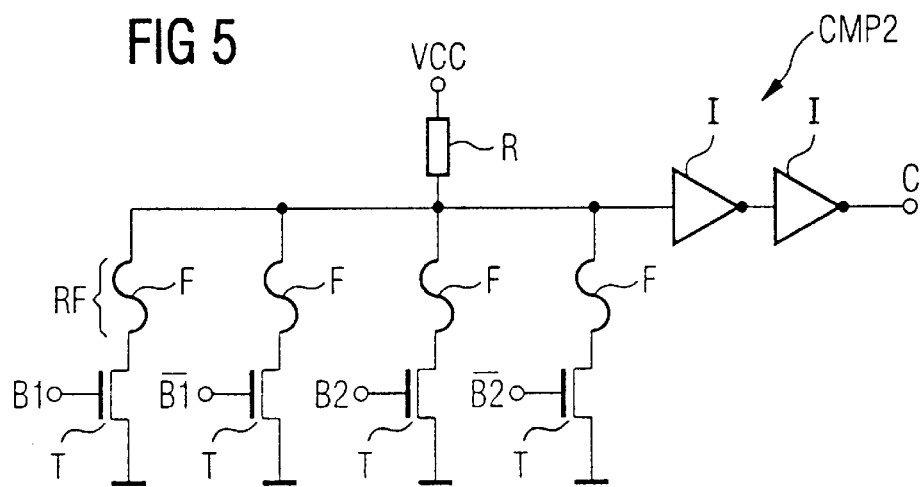

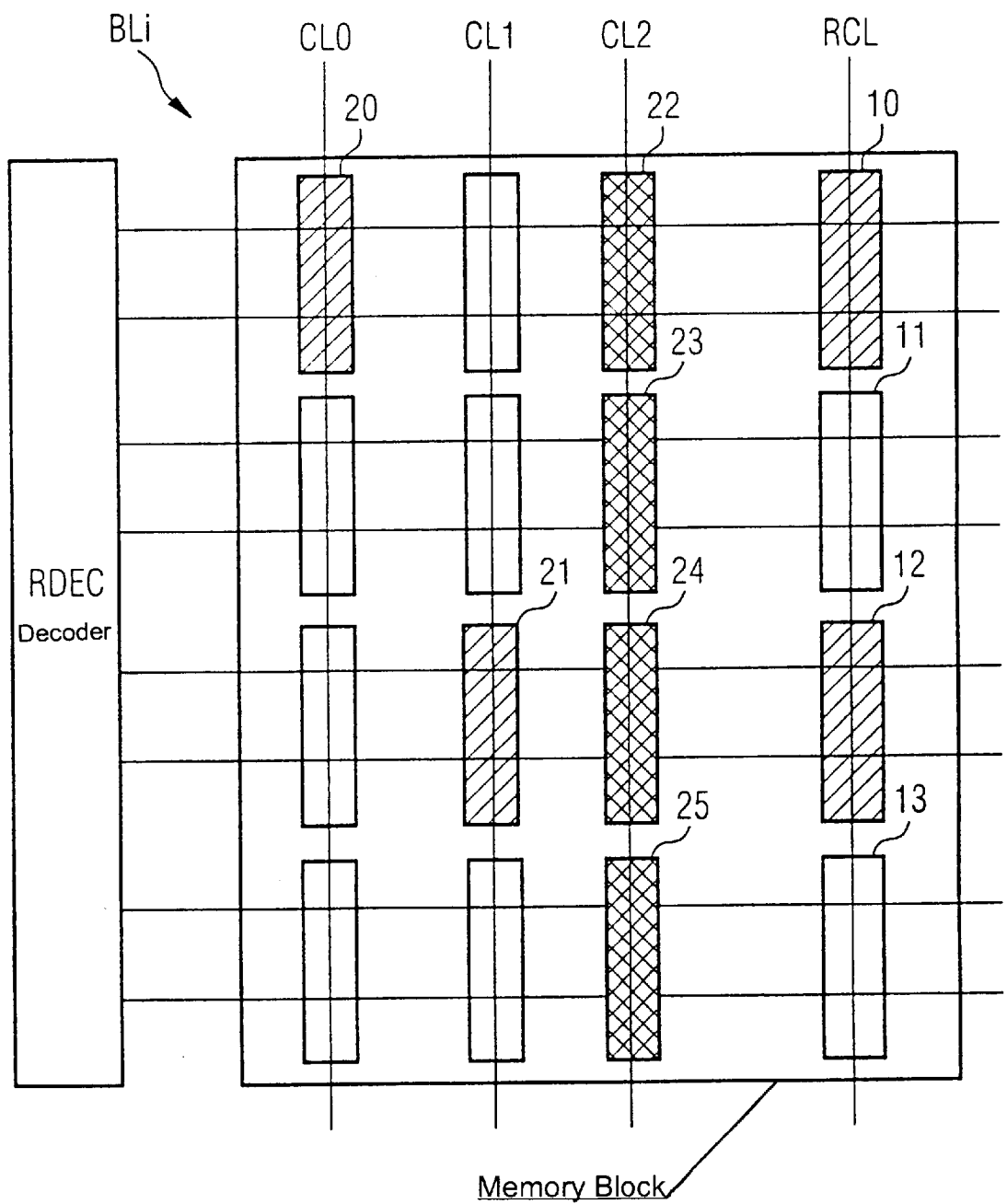

INTEGRATED MEMORY HAVING A REDUNDANCY FUNCTION

BACKGROUND OF THE INVENTION

Field of the Invention

The invention relates to an integrated memory having a redundancy function.

In addition to the regular word lines and bit lines, integrated memories often have so-called redundant word lines and/or redundant bit lines. If there is a fault on one of the regular word lines or bit lines, this word line or bit line is replaced by the appropriate redundant line on an address basis. Therefore, such a memory can operate without faults.

Published, European Patent Application EP 0 612 074 A1 describes an integrated memory which has redundant columns. In order to allocate one of the redundant columns to a corresponding regular column, which has a plurality of bit lines, on an address basis, the memory has coding units. These can be used independently of block, with the result that, by programming a block address and a column address, each coding unit can be allocated to a redundant column in any memory block. In this way, fewer coding units are required for repairing faults than if each coding unit were allocated to only one particular memory block.

U.S. Pat. No. 4,051,354 describes a memory in which redundant word or bit lines are each subdivided into subregions which, independently of one another, can be allocated to corresponding subregions of the regular bit lines or word lines and replace these on an address basis. In this way, a plurality of faults on different regular bit lines can be repaired using only one redundant bit line, for example.

In U.S. Pat. No. 4,051,356 each subregion of the redundant line has associated coding elements allowing allocation to a regular subregion which is to be replaced. Hence, there is exactly the same number of groups of coding elements as subregions of all the redundant lines.

SUMMARY OF THE INVENTION

It is accordingly an object of the invention to provide an integrated memory having a redundancy function that overcomes the above-mentioned disadvantages of the prior art devices of this general type, in which the number of coding units necessary for allocation to regular lines on an address basis can be reduced without significantly reducing the reparability of the memory. With the foregoing and other objects in view there is provided, in accordance with the invention, an integrated memory, including:

addressable first lines having subregions;

addressable second lines intersecting said first lines;

memory cells disposed at intersections of the first lines and the second lines;

redundant lines each subdivided into subregions on an address basis for replacing the first lines and intersecting the second lines;

redundant memory cells connected to the redundant lines; and coding units for allocating any one of the redundant lines at a time to any one of the first lines on the address basis, each of the coding units having a programmable activation unit whose programming state determines if an associated coding unit, when programmed, allocates a complete redundant line to a complete first line on the address basis, and if the associated coding unit, when programmed, allocates only one of the subregions of one of the redundant lines to a corresponding subregion of one of the first lines on the address basis.

In the integrated memory according to the invention, each coding unit has an associated programmable activation unit whose programming state affects the operation of the coding unit. In a first programming state of the activation unit, the associated coding unit, when programmed, allocates a complete redundant line to a complete first line on an address basis. In a second programming state of the activation unit, the associated coding unit, when programmed, allocates only one of the subregions of one of the redundant lines to a corresponding subregion of one of the first lines on an address basis.

Thus, the activation unit of each coding unit determines whether, as a result of the programming of the coding unit, either a complete first line is replaced by a complete redundant line or only a subregion of a first line is replaced by a corresponding subregion of one of the redundant lines. Since each coding unit can be allocated to any one of the redundant lines, the invention makes it possible for the coding units to be allocated to the redundant lines or to their subregions in such a way that the existing redundant lines and the existing coding elements are utilized in optimum fashion.

In accordance with an added feature of the invention, the first lines are bit lines and the second lines are word lines. Alternatively, the first lines can be word lines and the second lines are bit lines.

If a plurality of faulty subregions are disposed on a common first line, it may be beneficial for the relevant first line to be replaced completely by a redundant line, for which purpose, according to the invention, only one of the coding units is necessary. In practice, for example, faults on a complete line are relatively frequent. The invention makes it possible to repair such faults by using only one of the coding units. At the same time, the memory according to the invention affords the advantage that subregions, too, of the redundant lines can be used on an individual basis to repair corresponding subregions of the regular first lines by allocating one of the coding units at a time. This permits faulty subregions of a plurality of the first lines to be repaired using a plurality of subregions of only one of the redundant lines. Therefore, in the first instance, the number of redundant lines in the memory according to the invention can be kept small in comparison with memories in which only complete lines can be replaced. In the second instance, the number of coding units can also be kept relatively small in comparison with a memory in which each subregion of the redundant lines has a respective coding unit permanently associated with it, as is the case, for example, in U.S. Pat. No. 4,051,354, mentioned in the introduction. Since fewer redundant lines and/or coding units need to be provided for repairing faults in the memory according to the invention than in known memories, the memory according to the invention has a lower space requirement than known memories. This is because each additionally required redundant line and each additionally required coding unit increases the area required for producing the memory.

By way of example, the first lines can be bit lines and the redundant lines can be redundant bit lines. However, the first lines can also be word lines and the redundant lines can be redundant word lines. In other illustrative embodiments of the invention, each coding unit can also be used, by way of example, to allocate an appropriate redundant column to a regular column containing a plurality of bit lines.

In accordance with one development of the invention, the coding units of the integrated memory have, among other things, third subunits, which, when programmed, allocate the associated coding unit to a particular subregion of the redundant line associated with it via a first subunit and of the first line associated with it via a second subunit. The programming state of the third subunits is evaluated only if the activation unit associated with the respective coding unit has an appropriate programming state. This distinguishes whether the respective coding unit is allocating the associated redundant line to the associated first line completely or whether this is the case only for a subregion.

In accordance with one development of the invention, the subregions of the redundant lines and first lines are distinguished using a subaddress derived from second addresses, in which case the second addresses are used to address second lines intersecting the first lines. The memory cells of the memory are disposed at the intersections. If the respective coding unit is allocated to a complete redundant line, the subaddresses derived from the second addresses are not taken into account. However, if the coding unit is allocated to only a subregion of one of the redundant lines, this subregion is identified using the subaddresses derived from the second addresses.

In accordance with an additional feature of the invention, the coding units each have a first, a second and a third programmable subunit. The first programmable subunit when programmed allocates the associated coding unit to a particular one of the redundant lines. The second programmable subunit when programmed allocates the associated coding unit to a particular one of the first lines which is to be replaced on the address basis by a redundant line associated with the associated coding unit via the first programmable subunit. The third programmable subunit when programmed allocates the associated coding unit to a particular subregion of the redundant line associated with it via the first programmable subunit and of a first line associated with it via the second programmable subunit. And a programming state of the third programmable subunit is evaluated only if the programmable activation unit associated with the associated coding unit has an appropriate programming state.

In accordance with another feature of the invention, the first lines are addressed using first addresses and the second lines are addressed using second addresses. The coding units each have a first and a second comparison unit. The first comparison unit is supplied with the first addresses and with an address stored by the second programmable subunit and outputs a first result signal. The second comparison unit is supplied with subaddresses derived from the second addresses and with an address stored by the third programmable subunit and outputs a second result signal. The programmable activation unit has a first programming state in which the redundant line associated with the associated coding unit is activated on a basis of the first result signal output from the first comparison unit, but not from the second comparison unit. The programmable activation unit further has a second programming state in which the redundant line associated with the associated coding unit is activated on a basis of the first result signal and the second result signal from the first comparison unit and the second comparison unit, respectively.

In accordance with a concomitant feature of the invention, the number of the coding units is smaller than the number of the subregions of all of the redundant lines.

Other features which are considered as characteristic for the invention are set forth in the appended claims.

Although the invention is illustrated and described herein as embodied in an integrated memory having a redundancy function, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a circuit block diagram of an illustrative embodiment of a coding unit shown in FIG. 1;

FIG. 3 is a circuit block diagram of a memory block shown in FIG. 1;

FIG. 4 is a block diagram of second addresses and subaddresses derived therefrom; and FIG. 5 a circuit diagram of an illustrative embodiment of a subunit of a coding unit and of a comparison unit shown in FIG. 2.

DESCRIPTION OF THE PREFERRED EMBODIMENTS

Figure 1:
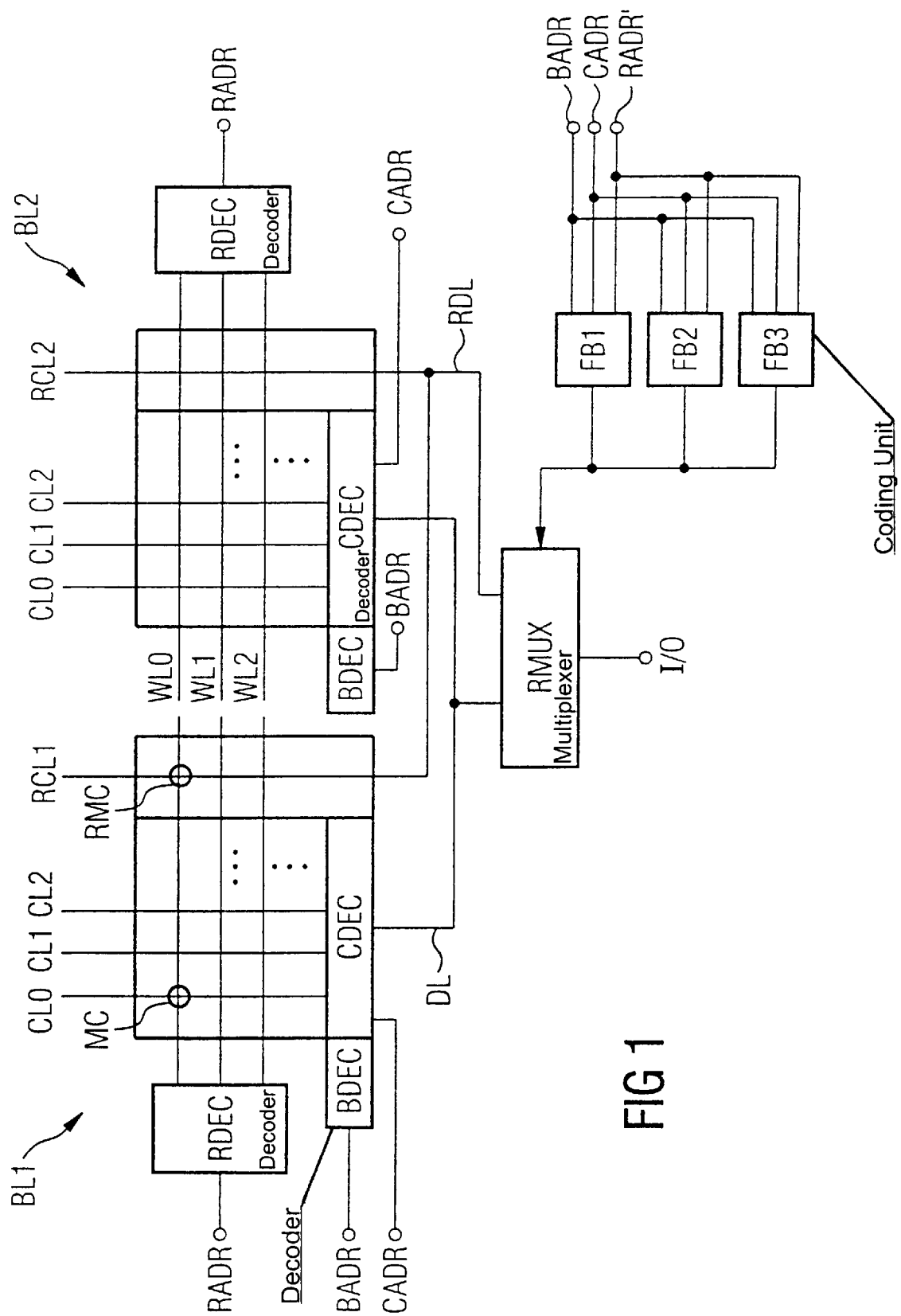
FIG. 1 is a circuit block diagram of an illustrative embodiment of an integrated memory according to the invention.

In all the figures of the drawing, sub-features and integral parts that correspond to one another bear the same reference symbol in each case. Referring now to the figures of the drawing in detail and first, particularly, to FIG. 1 thereof, there is shown a dynamic random access memory (DRAM) according to the invention. However, the invention can also be applied to any other integrated memories in which redundant lines are used. The memory in the illustrative embodiment has two memory blocks BL1, BL2, which each contain word lines WLk and bit lines CLi. Memory cells MC of the memory are situated at intersections of the word lines and bit lines. The word lines WLk can be addressed via line or row decoders RDEC using line or row addresses RADR. The bit lines CLi can be addressed via column decoders CDEC using column addresses CADR. In other illustrative embodiments of the invention, the memory blocks BL1, BL2 can also have a common column decoder CDEC.

Each memory block BL1, BL2 also has a block decoder BDEC to which a block address BADR is supplied. Depending on a block address BADR, only one of the memory blocks BL1, BL2 is ever active. Furthermore, each of the memory blocks BL1, BL2 has a redundant bit line RCL1, RCL2. Redundant memory cells RMC are situated at intersections of the word lines WLk with the redundant bit lines RCL1, RCL2. The redundant bit lines RCL1, RCL2 are used to replace the regular bit lines CLi on an address basis in order to repair faults.

The memory in FIG. 1 also has a redundancy multiplexer RMUX which, on the one hand, is connected to connections I/O and, on the other hand, is connected to the two memory blocks BL1, BL2 via a data line DL and a redundant data line RDL. The column decoders CDEC connect that bit line CLi of the respectively active memory block BL1, BL2 that is selected using the column address CADR to the data line DL. The two redundant bit lines RCL1, RCL2 are connected to the redundant data line RDL.

In the illustrative embodiment outlined here, no consideration was given to the fact that, in the case of DRAMs, a bit line pair is normally activated with each memory access operation. In addition, in a redundancy situation, the two bit lines in a bit line pair are usually always replaced by a redundant bit line pair. Hence, although only bit lines and redundant bit lines are under discussion here, in reality, bit line pairs and redundant bit line pairs are meant. Furthermore, memories in practice have a greater number of memory blocks and a greater number of redundant lines per memory block. In order to simplify illustration, only two memory blocks with only one redundant bit line each are considered in this illustrative embodiment.

In practice, the column address CADR is often used to address one column having a respective plurality of bit lines CLi. In such a memory, regular columns having a fault are replaced by appropriate redundant columns. It goes without saying that the invention can also be applied to such memories. In the illustrative embodiment outlined here, only the regular bit lines CLi and the redundant bit lines RCL1, RCL2 are to be replaced by appropriate columns.

The memory in FIG. 1 also has coding units FB1 to FB3 whose outputs are connected to the redundancy multiplexer RMUX. The coding units FB1-FB3 contain programmable elements in the form of electrical connections (fuses) which can be blown using a laser beam. Depending on a programming state of the fuses, the coding units FB1 ... 3 allocate one of the redundant bit lines RCL1, RCL2 or a subregion of the redundant bit lines to a complete one of the bit lines CLi or to a subregion of one of the bit lines on an address basis. The coding units FB1 ... 3 are supplied with the block addresses BADR, the column addresses CADR and also with subaddresses RADR' derived from the line addresses RADR.

FIG. 4 shows the composition of the subaddresses RADR'. By way of example, it is assumed that the line addresses RADR have three bits. The subaddresses RADR' are formed by the two most significant bits B2 and B1 of the line addresses RADR.

The redundancy multiplexer RMUX connects the regular data line DL to the connection I/O provided that none of the coding units FBn are supplying it with a high level. The connection I/O can then be used to access the regular bit line CLi addressed in the particular instance. However, if a high level (i.e. logic "1") is supplied to the redundancy multiplexer RMUX by one of the coding units FBn, the redundancy multiplexer RMUX connects the connection I/O to the redundant data line RDL, which is connected to the redundant bit lines RCL1, RCL2.

FIG. 2 shows, by way of example, the structure of one of the coding units FBn from FIG. 1. It has a first subunit BF for storing a block address, a second subunit CF for storing a column address, and a third subunit RF for storing a subaddress. The subunits BF, CF, RF contain the aforementioned fuses for storing the addresses. The first subunit BF is supplied with the block addresses BADR, the second subunit CF is supplied with the column addresses CADR, and the third subunit RF is supplied with the subaddresses RADR', which are derived from the line addresses RADR. The second subunit CF has a first comparison unit CMP1, associated with it, the third subunit RF has a second comparison unit CMP2 associated with it, and the first subunit BF has a third comparison unit CMP3 associated with it. The comparison units CMPi compare the addresses stored in the subunits BF, CF, RF with the current addresses BADR, CADR, RADR'.

As FIG. 2 shows, each of the coding units FBn also has an initialization unit FE, an activation unit AKT, an AND gate AND, and an OR gate OR. Both the initialization unit FE and the activation unit AKT have a respective fuse whose programming state (intact or blown) defines the level of its output signal. The programming state of the initialization unit FE indicates whether or not the associated coding unit FBn is provided for repairing a fault. If the coding unit FBn is provided for repair (that is to say for allocating one of the redundant bit lines to one of the regular bit lines on an address basis), the output signal from the initialization unit FE has a high level, and otherwise has a low level.

The output of the second comparison unit CMP2 is connected to a first input, and an output of the activation unit AKT is connected to a second input of the OR gate OR. The activation unit AKT defines whether the respective coding unit FBn is used for allocating a complete one of the redundant bit lines RCL1, RCL2 to a complete one of the regular bit lines CLi, or for allocating only a subregion of one of the redundant bit lines to a subregion of one of the regular bit lines. If the activation unit ATK delivers a high level, the coding unit FBi allocates a complete regular bit line to a complete redundant bit line. With a low level, the coding unit allocates only corresponding subregions to one another, these being identified by the subaddress stored in the third subunit RF.

The outputs of the initialization unit FE, the first comparison unit CMP1, the third comparison unit CMP3 and the OR gate OR are connected to appropriate inputs of the AND gate AND. An output of the AND gate AND is an output of the respective coding unit FBn. As shown in FIG. 1, this output is connected to the input of the redundancy multiplexer RMUX.

FIG. 5 shows the structure of the third subunit RF and of the second comparison unit CMP2 in the coding unit FBn from FIG. 2. The third subunit RF has four fuses F. One side of these is connected to ground via a respective transistor T. The other side of the fuses F is connected to an output C of the second comparison unit CMP2 via a series circuit containing two inverters I and to a positive supply potential VCC via a pull-up resistor R. The control connections of the transistors T are supplied with the two bits B1, B2 of the subaddresses RADR' in inverted and uninverted form, respectively. The fuses F are programmed by blowing them selectively. They are programmed such that the output C is at a high level only when the desired subaddress RADR' for the memory cells to be replaced is applied.

The remaining subunits BF, CF and comparison units CMP1, CMP3 are of similar structure to that in FIG. 5.

FIG. 3 shows one of the memory blocks BLi, in which subregions 20 to 25 of the regular bit lines CLi and also subregions 10 to 13 of the redundant bit line RCL have been shown. First, consideration is given to the case in which two subregions 20, 21 of the regular bit lines CL0, CL1 are to be replaced by corresponding subregions 10, 12 of the redundant bit line RCL. In this case, subregion 20 needs to be replaced, on an address basis, by subregion 10, and subregion 21 needs to be replaced by subregion 12. This requires one of the coding units FBn in each case. The latter need to be programmed such that their first subunit BF stores the address of the appropriate block BLi, their second subunit CF stores the address of the bit line CLi which is to be replaced, and the third subunit RF stores the subaddress (derived from the line address) of the appropriate subregion 20, 21. In addition, the initialization unit FE and the activation unit AKT of the two coding units FBn need to be programmed such that the former delivers a high level at its output and the latter delivers a low level. Only then are the coding units FBn activated for replacing the appropriate subregions 20, 21 by the subregions 10, 12 of the redundant bit line RCL. Hence, replacement of the two faulty subregions 20, 21 requires two of the coding units FBn but only one of the redundant lines RCL.

FIG. 3 shall now be used to consider another fault distribution. This time, all the subregions 22 to 25 of the bit line CL2 are assumed to be faulty. Such a fault can be repaired only by allocating the redundant bit line RCL to the regular bit line CL2 completely on an address basis. Now, instead of allocating each subregion 10 to 13 of the redundant bit line RCL to a respective one of the subregions 22 to 25 of the regular bit line CL2 using one of the coding units FBn, in the memory according to the invention, the whole redundant bit line RCL can be allocated to the whole regular bit line CL2 using only one of the coding units FBn. This is done by storing the address of the appropriate block BLi in the first subunit BF and storing the address of the relevant regular bit line CL2 in the second subunit CF. In addition, the initialization unit FE needs to be programmed such that it produces a high level at its output. The activation unit AKT in the coding unit FBn likewise needs to be programmed such that it produces a high level at its output. As FIG. 2 shows, the result of this is that, irrespective of the level at the output C of the second comparison unit CMP2, there is always a high level at the output of the OR gate OR. Hence, no evaluation of the subaddresses RADR' takes place with this coding unit FBn. The use of only one coding unit FBn thus makes it possible for all subregions 22 to 25 of the regular bit line CL2 to be replaced by the corresponding subregions 10 to 13 of the redundant bit line R CL.

I claim:

1. An integrated memory, comprising:
   addressable first lines having subregions;
   addressable second lines intersecting said first lines;
   memory cells disposed at intersections of said first lines and said second lines;
   redundant lines each subdivided into subregions on an address basis for replacing said first lines and intersecting said second lines;
   redundant memory cells connected to said redundant lines; and
   coding units for allocating any one of said redundant lines at a time to any one of said first lines on the address basis, each of said coding units having a programmable activation unit whose programming state determines if an associated coding unit, when programmed, allocates a complete redundant line to a complete first line on the address basis, and if said associated coding unit, when programmed, allocates only one of said subregions of one of said redundant lines to a corresponding subregion of one of said first lines on the address basis.

2. The integrated memory according to claim 1, wherein said first lines are bit lines and said second lines are word lines.

3. The integrated memory according to claim 1, wherein said first lines are word lines and said second lines are bit lines.

4. The integrated memory according to claim 1, wherein said coding units each have a first, a second and a third programmable subunit, said first programmable subunit when programmed allocates said associated coding unit to a particular one of said redundant lines, said second programmable subunit when programmed allocates said associated coding unit to a particular one of said first lines which is to be replaced on the address basis by a redundant line associated with said associated coding unit via said first programmable subunit, said third programmable subunit when programmed allocates said associated coding unit to a particular subregion of the redundant line associated with it via said first programmable subunit and of a first line associated with it via said second programmable subunit, and a programming state of said third programmable subunit is evaluated only if said programmable activation unit associated with said associated coding unit has an appropriate programming state.

5. The integrated memory according to claim 4, wherein:
   said first lines are addressed using first addresses and said second lines are addressed using second addresses;
   said coding units each have a first and a second comparison unit, said first comparison unit is supplied with the first addresses and with an address stored by said second programmable subunit and outputs a first result signal, said second comparison unit is supplied with subaddresses derived from the second addresses and with an-address stored by said third programmable subunit and outputs a second result signal;
   said programmable activation unit has a first programming state in which said redundant line associated with said associated coding unit is activated on a basis of the first result signal output from said first comparison unit, but not from said second comparison unit; and
   said programmable activation unit has a second programming state in which the redundant line associated with said associated coding unit is activated on a basis of the first result signal and the second result signal from said first comparison unit and said second comparison unit, respectively.

6. The integrated memory according to claim 1, wherein a number of said coding units is smaller than a number of said subregions of all of said redundant lines.

* * * * *